(12) United States Patent
Vaartstra et al.

(10) Patent No.: US 6,863,725 B2
(45) Date of Patent: Mar. 8, 2005

(54) METHOD OF FORMING A $TA_2O_5$ COMPRISING LAYER

(75) Inventors: Brian A. Vaartstra, Nampa, ID (US); Trung Tri Doan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 107 days.

(21) Appl. No.: 10/358,764

(22) Filed: Feb. 4, 2003

(65) Prior Publication Data
US 2004/0152254 A1 Aug. 5, 2004

(51) Int. Cl.⁷ .............................................. C23C 16/40
(52) U.S. Cl. .................. 117/84; 117/92; 427/255.31; 427/576
(58) Field of Search .................... 427/255.31, 576; 117/84, 92

(56) References Cited

U.S. PATENT DOCUMENTS

| | | |
|---|---|---|
| 5,372,974 A | 12/1994 | Doan et al. |
| 5,691,235 A | 11/1997 | Meikle et al. |
| 6,149,828 A | 11/2000 | Vaartstra |
| 6,159,818 A | 12/2000 | Durcan et al. |
| 6,249,040 B1 * | 6/2001 | Lin et al. ............... 257/532 |

(List continued on next page.)

FOREIGN PATENT DOCUMENTS

EP    1205574 A2 * 5/2002 ........... C23C/16/40

OTHER PUBLICATIONS

U.S. Appl. No. 10/133,947, filed Apr. 25, 2002, Vaartstra (as filed).
U.S. Appl. No. 10/229,653, filed Aug. 28, 2002, Vaartstra(as filed).

Chaneliere et al., *Dielectric Permittivity of Amorphous and Hexagonal Electron Cyclotron Resonance Plasma . . .* , 2 Electrochem. and Solid–State Ltrs., No. 6, pp. 291–293 (1999).

Kishiro et al., *Structure and Electrical Properties of Thin $Ta_2O_5$ Deposited on Metal Electrodes*, 37 Jpn. J. Appl. Phys. pp. 1336–1339 (1998).

Lin et al., *$Ta_2O_5$ thin films exceptionally high dielectric constant*, 74 Appl. Phys. Ltrs., No. 16, pp. 2370–2372 (Apr. 19, 1999).

Luo et al., *Effects of Deposition conditions on the fluorine and hydrogen concentration in tantalum pentoxide . . .* , 17 J. Vac. Sci. Technol., No. 6, pp. 3235–3239 (Nov./Dec. 1999).

Devine et al., *Use of carbon–free $Ta_2O_5$ thin–films as a gate–insulator*, 36 Microelectronic Engineering 61–64 (1997).

Four et al., *Properties of tantalum pentoxide ($Ta_2O_5$) obtained by plasma assisted deposition using a $TaF_5$ Source*, 254 Journal of Non–Crystalline Solids 139–145 (1999).

*Primary Examiner*—Timothy Meeks
(74) *Attorney, Agent, or Firm*—Wells St. John P.S.

(57) ABSTRACT

In one aspect, a substrate is positioned within a deposition chamber. Gaseous precursors comprising $TaF_5$ and at least one of $H_2O$ and $O_3$ are fed to the deposition chamber under conditions effective to deposit a $Ta_2O_5$ comprising layer on the substrate. In one implementation, a substrate is positioned within a deposition chamber. A first species is chemisorbed onto the substrate within the chamber to form a first species monolayer from a gaseous first precursor comprising $TaF_5$. The chemisorbed first species is contacted with a gaseous second precursor comprising at least one of $H_2O$ and $O_3$ to react with the first species to form a monolayer comprising Ta and O. The chemisorbing and contacting are successively repeated under conditions effective to form a mass of material on the substrate comprising $Ta_2O_5$.

70 Claims, 3 Drawing Sheets

U.S. PATENT DOCUMENTS

| | | |
|---|---|---|
| 6,280,793 B1 | 8/2001 | Atwell et al. |
| 6,281,091 B1 | 8/2001 | Durcan et al. |
| 6,291,289 B2 | 9/2001 | Rhodes et al. |
| 6,319,832 B1 | 11/2001 | Uhlenbrock et al. |
| 6,325,017 B1 | 12/2001 | DeBoer et al. |
| 6,329,263 B1 | 12/2001 | Durcan et al. |
| 6,333,240 B1 | 12/2001 | Durcan et al. |
| 6,342,277 B1 * | 1/2002 | Sherman ............... 427/562 |
| 6,388,284 B2 | 5/2002 | Rhodes et al. |
| 6,391,735 B1 | 5/2002 | Durcan et al. |
| 6,395,600 B1 | 5/2002 | Durcan et al. |
| 6,429,086 B1 | 8/2002 | Meikle et al. |
| 6,445,023 B1 | 9/2002 | Vaartstra et al. |
| 6,461,982 B2 * | 10/2002 | DeBoer et al. ............ 438/778 |
| 6,472,323 B1 | 10/2002 | Meikle et al. |
| 6,495,459 B2 | 12/2002 | Uhlenbrock et al. |
| 6,528,834 B1 | 3/2003 | Durcan et al. |
| 6,573,199 B2 | 6/2003 | Sandhu et al. |
| 6,608,342 B1 | 8/2003 | Durcan et al. |
| 6,613,702 B2 | 9/2003 | Sandhu et al. |
| 6,620,680 B2 | 9/2003 | Duncan et al. |
| 6,656,839 B2 | 12/2003 | Uhlenbrock et al. |
| 6,661,051 B1 | 12/2003 | Durcan et al. |
| 6,664,159 B2 | 12/2003 | Vaartstra et al. |
| 6,666,986 B1 | 12/2003 | Vaartstra |
| 6,683,005 B2 | 1/2004 | Sandhu et al. |
| 6,690,044 B1 | 2/2004 | Doan et al. |
| 6,693,319 B1 | 2/2004 | Durcan et al. |
| 6,720,272 B2 | 4/2004 | Sandhu et al. |
| 6,730,954 B2 | 5/2004 | Meikle et al. |
| 6,753,565 B1 | 6/2004 | Durcan et al. |
| 6,764,956 B2 | 7/2004 | Sandhu et al. |
| 6,773,495 B2 | 8/2004 | Uhlenbrock et al. |
| 6,784,049 B2 | 8/2004 | Vaartstra |
| 2001/0020448 A1 | 9/2001 | Vaartstra et al. |
| 2001/0024387 A1 * | 9/2001 | Raaijmakers et al. ....... 365/200 |
| 2001/0036752 A1 | 11/2001 | DeBoer et al. |
| 2002/0045322 A1 | 4/2002 | Meikle et al. |
| 2002/0094634 A1 * | 7/2002 | Chung et al. ............... 438/240 |
| 2002/0098654 A1 | 7/2002 | Durcan et al. |
| 2002/0125508 A1 | 9/2002 | Durcan et al. |
| 2002/0187654 A1 | 12/2002 | DeBoer et al. |
| 2004/0043633 A1 | 3/2004 | Vaartstra |
| 2004/0043636 A1 | 3/2004 | Vaartstra et al. |

* cited by examiner

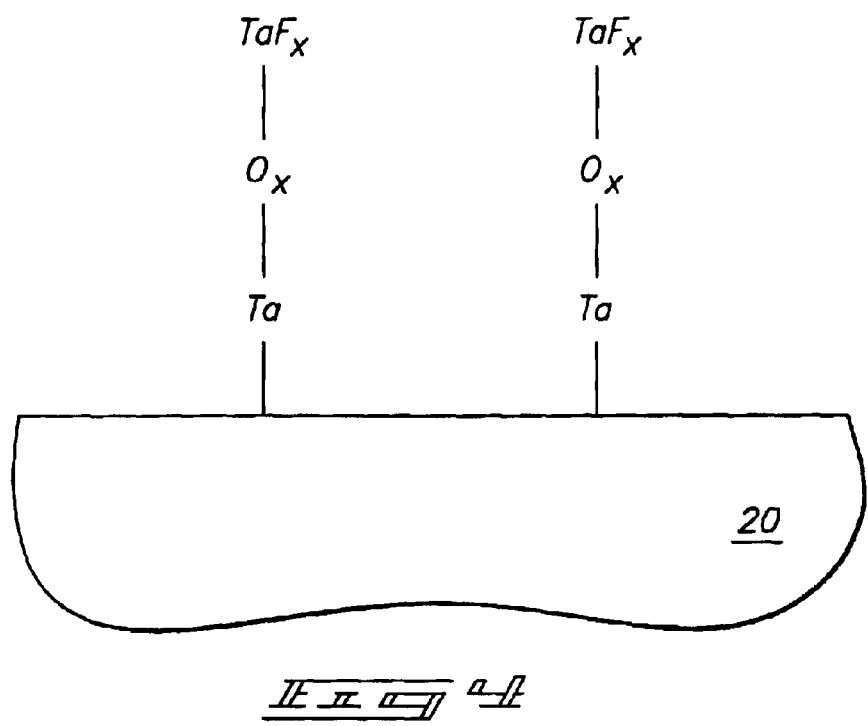
_Fig. 4_
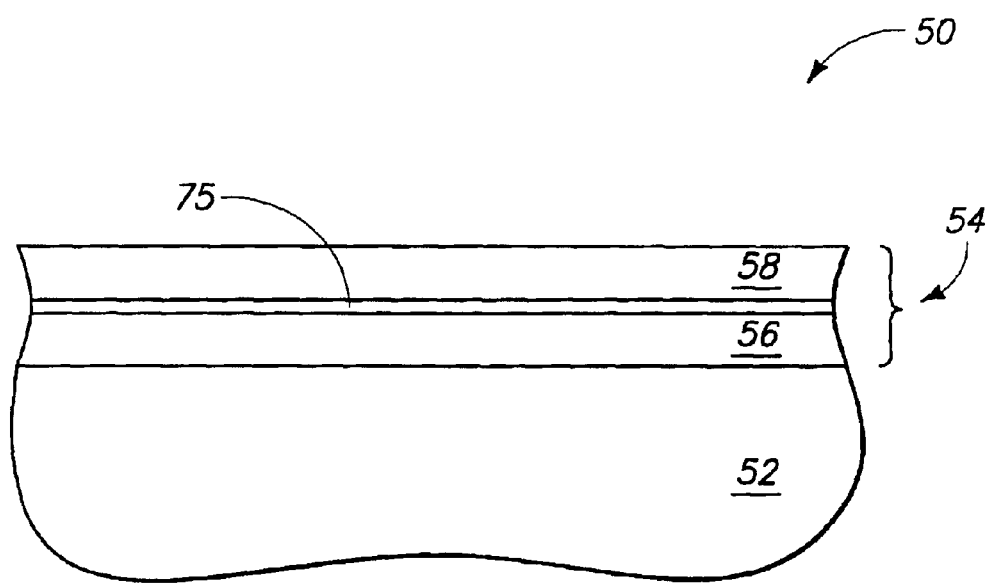
_Fig. 5_

US 6,863,725 B2

METHOD OF FORMING A $Ta_2O_5$ COMPRISING LAYER

TECHNICAL FIELD

This invention relates to methods of forming $Ta_2O_5$ comprising layers.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. Highly integrated memory devices are expected to require a very thin dielectric film for the 3-dimensional capacitor of cylindrically stacked or trenched structures. To meet this requirement, the capacitor dielectric film thickness may be at or below 10 Angstroms of equivalent $SiO_2$ thickness.

Insulating inorganic metal oxide materials (such as ferroelectric materials, perovskite materials and dielectric oxides) are commonly referred to as "high k" materials due to their high dielectric constants, which make them attractive as dielectric materials in capacitors, for example for high density DRAMs and non-volatile memories. Using such materials can enable the creation of much smaller and simpler capacitor structures for a given stored charge requirement, enabling the packing density dictated by future circuit design. One such material is tantalum pentoxide ($Ta_2O_5$). $Ta_2O_5$ can, of course, also be used in fabrication of materials other than capacitor dielectrics and in circuitry other than DRAM.

The dielectric constant of tantalum pentoxide can vary in a range from about 25 to in excess of 100. Typical prior art methods of forming tantalum pentoxide result in an initial deposition in the amorphous phase, and which also results in dielectric constants in the lowest portions of the range. Accordingly, subsequent anneal processes are typically employed to convert the material to various crystalline phases to achieve a significantly higher dielectric constant than the amorphous phase. Typical amorphous deposition processes include low pressure chemical vapor deposition utilizing tantalum organometallics. One inorganic process for depositing amorphous tantalum pentoxide utilizes chemical vapor deposition that is plasma enhanced using $TaF_5$ with an $O_2/H_2$ plasma.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming $Ta_2O_5$ comprising layers. In one implementation, such includes positioning a substrate within a deposition chamber. Gaseous precursors comprising $TaF_5$ and at least one of $H_2O$ and $O_3$ are fed to the deposition chamber under conditions effective to deposit a $Ta_2O_5$ comprising layer on the substrate.

In one implementation, a substrate is positioned within a deposition chamber. A first species is chemisorbed onto the substrate within the chamber to form a first species monolayer from a gaseous first precursor comprising $TaF_5$. The chemisorbed first species is contacted with a gaseous second precursor comprising at least one of $H_2O$ and $O_3$ to react with the first species to form a monolayer comprising Ta and O. The chemisorbing and contacting are successively repeated under conditions effective to form a mass of material on the substrate comprising $Ta_2O_5$.

Other aspects and implementations are contemplated.

BRIEF DESCRIPTION OF THE DRAWINGS

Preferred embodiments of the invention are described below with reference to the following accompanying drawings.

FIG. 4 is a diagrammatic depiction of still another substrate fragment.

FIG. 5 is a diagrammatic depiction of yet another substrate fragment.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
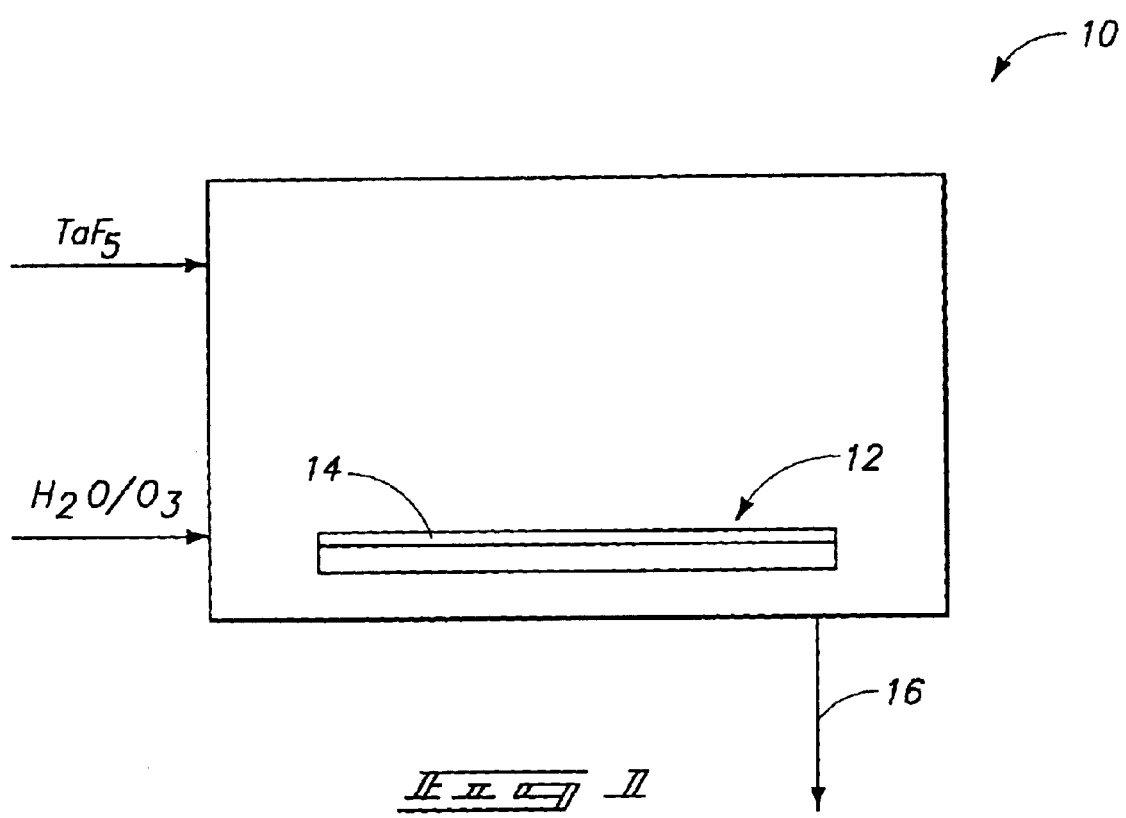
FIG. 1 is a diagrammatic depiction of a processing chamber having a substrate positioned therein.

An exemplary method of forming a $Ta_2O_5$ comprising layer on a substrate is described initially with reference to FIG. 1. Diagrammatically shown is a deposition chamber 10 within which a substrate 12, for example a semiconductor substrate, has been positioned. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Gaseous precursors comprising $TaF_5$ and at least one of $H_2O$ and $O_3$ are fed to deposition chamber 10 under conditions effective to deposit a $Ta_2O_5$ comprising layer 14 upon substrate 12. Such might be conducted by atomic layer deposition (ALD) methods (for example including chemisorbing and contacting methods), by chemical vapor deposition methods (CVD), by other methods, as well as by a combination of these and other methods. CVD and ALD are used herein as referred to in the co-pending U.S. patent application Ser. No. 10/133,947, filed on Apr. 25, 2002, entitled "Atomic Layer Deposition Methods and Chemical Vapor Deposition Methods", and listing Brian A. Vaartstra as the inventor. This 10/133,947 application filed on Apr. 25, 2002 is hereby fully incorporated by reference as if presented in its entirety herein.

FIG. 1 diagrammatically depicts separate $TaF_5$ and one or both of $H_2O$ and $O_3$ precursor feed streams to chamber 10. More or fewer precursor feed streams could be provided, of course. Further, feed streams might be combined and mixed prior to feeding to chamber 10. An exemplary vacuum controlling drawdown/exhaust line 16 extends from chamber 10 for exhausting unreacted gas and by-product from the substrate, and for controlling chamber pressure. The deposition conditions can comprise plasma generation of at least one or all of the precursors, or be void of plasma generation of any of the precursors. Further, any such plasma generation might be within deposition chamber 10 and/or remote therefrom.

$TaF_5$ is a solid at room ambient conditions. Such is preferably heated to a temperature of from 40° C. to 110° C., and more preferably from 60° C. to 80° C., thereby causing it to sublime. An inert carrier gas, for example He, can be flowed over the subliming solid to move the $TaF_5$ vapor to the chamber. An exemplary flow rate for the He is from 5 sccm to 400 sccm for a 14,000 cm$^3$ volume deposition chamber. $H_2O$ can be provided to the chamber from a bubbler/vaporizer, with an exemplary flow rate for a 14,000 cm$^3$ volume reactor being from 5 sccm to 400 sccm. In addition to or in lieu of the $H_2O$ precursor feed, an exemplary $O_3$ precursor stream flow is a mixture of $O_3$ and $O_2$ at from 25 sccm to 400 sccm, with the feed stream being from 3% to 15% by weight $O_3$, the remainder being $O_2$. Such could be created from any suitable existing or yet-to-be-developed ozone generator. Accordingly, the invention in one aspect also contemplates a combined feeding of $O_3$ and $O_2$ without feeding $H_2O$ to the chamber, or in combination with $H_2O$. Further and regardless, the $H_2O$, $O_3$ and $O_2$ might separately be fed at different exclusive times, at different and partially overlapping times, or in combination.

Further, the deposition conditions can include feeding $TaF_5$ and at least one of the $H_2O$ and $O_3$ to the deposition chamber at the same time or at different respective times. Further when flowed at different respective times, some of the $TaF_5$ and at least one of the $H_2O$ and $O_3$ feedings might overlap in time or not overlap in time.

Preferred conditions include a substrate temperature of from about 200° C. to about 400° C., more preferably from about 250° C. to about 300° C., and even more preferably at a temperature of at least 275° C. The deposition conditions are also preferably subatmospheric, with a preferred pressure range being from about $1 \times 10^{-7}$ Torr to about 10 Torr, and more preferably from about $1 \times 10^{-3}$ Torr to about 10 Torr.

Regardless, the conditions are preferably effective to form at least a majority of the $Ta_2O_5$ to be crystalline in the 001 oriented hexagonal phase as initially deposited, and regardless of whether the outer surface of substrate 12 upon which the material is deposited is substantially crystalline or substantially amorphous. In the context of this document, "substantially crystalline" and "substantially amorphous" define a layer having at least 90% of the stated crystalline or amorphous attribute. In a less preferred embodiment, the deposition might form less than a majority of the $Ta_2O_5$ to be crystalline in a 001 oriented hexagonal phase as initially deposited. In such less preferred embodiment, the substrate with initially deposited layer might then be annealed at a temperature of from about 400° C. to 800° C. effective to form at least a majority of the $Ta_2O_5$ to be crystalline in a 001 oriented hexagonal phase. Such annealing might occur in the same or a different chamber than which the initial deposition occurred.

Where the conditions comprise feeding $TaF_5$ and at least one of $H_2O$ and $O_3$ to the deposition chamber at different respective times, the conditions might be void of any inert purge gas feeding to the chamber at any time intermediate such different respective times. Alternately by way of example only, the conditions might comprise a period of time intermediate the different respective times when no detectable gaseous precursor is fed to the chamber, and with an inert purge gas being fed to the chamber during at least some of that intermediate period of time. Regardless and in one preferred method, the conditions are void of any detectable level of $H_2$ being fed to the deposition chamber.

One exemplary reduction-to-practice example utilized/resulted in CVD in the absence of plasma in a pulsed precursor method with the conditions comprising reaction of the gaseous $TaF_5$ and at least one of $H_2O$ and $O_3$ within the chamber and subsequently depositing material comprising $Ta_2O_5$ on the substrate. Specifically, $Ta_2O_5$ was deposited using $TaF_5$ and separate water vapor/steam pulses to form an 1800 Angstroms layer of $Ta_2O_5$ after 550 cycles, and which was in a highly 001 oriented hexagonal phase as-deposited and had less than two atomic percent fluorine. Substrate temperature was 275° C. The $TaF_5$ pulses were unmetered from a 70° C. reservoir for 1 second long each, and the $H_2O$ pulses were 10 sccm for 1 second long each. The reactor was purged with argon (30 sccm) for 1 second and pumped out for 2 seconds after each of the $TaF_5$ and ozone pulses. The purging/pumping was apparently not effective in removing all excess water vapor in light of a non-limiting, CVD rate of deposition being obtained.

Preferred pulse times for the $TaF_5$ vapor are from 0.1 second to 5 seconds, and more preferably from 0.2 second to 2 seconds. Preferred pulse times for the $H_2O$ and/or $O_3$ vapor are from 0.1 second to 10 seconds, and more preferably from 1 second to 3 seconds.

Figure 2:
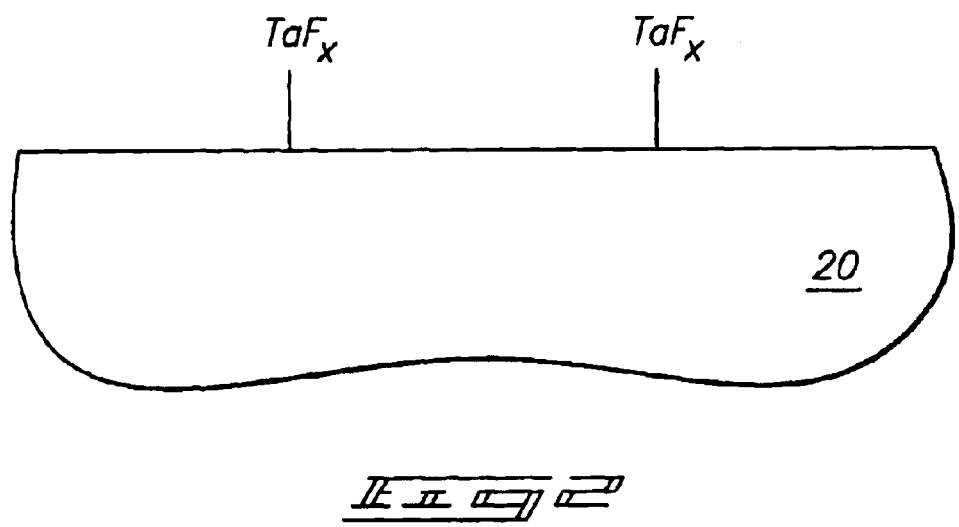
FIG. 2 is a diagrammatic depiction of a substrate fragment.

Exemplary atomic layer deposition methods are described with reference to FIGS. 2–4. FIG. 2 depicts a substrate 20 which would be positioned within a suitable deposition chamber. A gaseous first precursor comprising $TaF_5$ would be fed to the substrate within the chamber to chemisorb a first species onto the substrate to form a first species monolayer on the substrate. Of course, the first species monolayer may less than completely saturate the substrate surface, and thereby be discontinuous. FIG. 2 depicts an exemplary such species $TaF_x$, where "x" would be less than 5.

Figure 3:
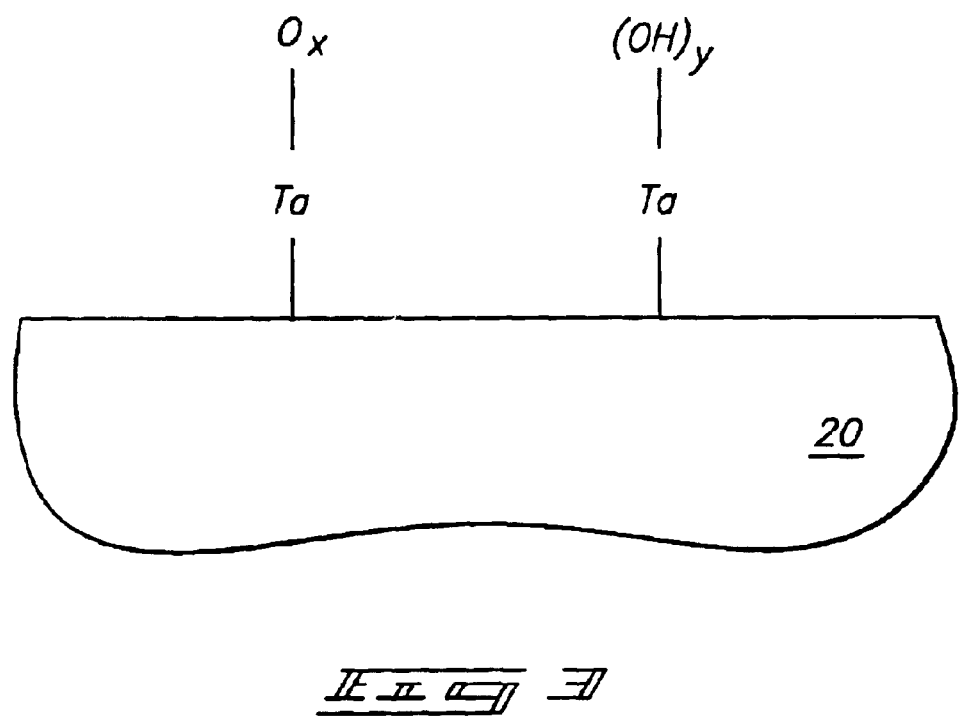
FIG. 3 is a diagrammatic depiction of another substrate fragment.

Referring to FIG. 3, the chemisorbed first species is contacted with a gaseous second precursor comprising at least one of $H_2O$ and $O_3$ to react with the first species to form a monolayer comprising both Ta and O. FIG. 3 depicts two such materials, $Ta-O_x$, where "x" would be less than 2.5 and largely result from $O_3$ exposure, and $Ta-(OH)_y$ and largely result from $H_2O$ exposure. The surface species might further be a combination of these, for example $Ta(O)_x(OH)_y$. A first species is chemisorbed onto the substrate within the chamber to form a first species monolayer from a gaseous first precursor comprising $TaF_5$.

FIG. 4 depicts subsequent exposure to a gaseous first precursor comprising $TaF_5$, again resulting in a first species chemisorbing and transformation of the $TaO_x$ and $Ta(OH)_y$ to a growing $Ta_2O_5$ mass. Accordingly, and by way of example only, such chemisorbing and contacting can be successively repeated under conditions which are effective to form a mass of material on the substrate comprising, consisting essentially of, or consisting of $Ta_2O_5$. Preferred and exemplary processing conditions are otherwise as described above, where applicable. Most preferably, the successive repeating is effective to form at least a majority of the $Ta_2O_5$ to be crystalline in the 001 oriented hexagonal phase, as initially deposited.

Further in one preferred embodiment, a period of time might be provided intermediate the chemisorbing and the contacting wherein no detectable gaseous precursor is fed to the chamber and with, if desired, an inert purge gas being fed to the chamber during such intermediate period of time or times. Further, the gaseous first or second precursors might be changed in composition, as selected by the artisan, one or more times during the successive repeating of chemisorbing and contacting. Further, the first species might be formed continuously or discontinuously over the substrate. Further if desired after at least some of the successively repeating, deposition mechanism might be switched to CVD, or start with CVD and switch to ALD. Regardless, the deposited mass might comprise, consist essentially of, or consist of $Ta_2O_5$ formed on the substrate.

FIG. 5 depicts but one exemplary preferred application in the fabrication of a substrate 50. Such comprises some base substrate material or materials 52 having a capacitor construction 54 formed thereon. Capacitor 54 includes first and second capacitor electrodes 56 and 58, respectively, having a capacitor dielectric region 75 sandwiched therebetween. Some or all of capacitor dielectric region 75 preferably comprises $Ta_2O_5$ deposited by any of the above-described methods. Exemplary reduction-to-practice capacitors fabricated in the above manners have shown dielectric constants near 100, with leakage in the high $10^{-8}$ amps/$cm^2$ range. One exemplary specific example utilized 1000 Angstroms thick sputtered platinum capacitor electrodes having a capacitor dielectric region consisting essentially of $Ta_2O_5$ deposited in accordance with the above method to a film thickness of 390 Angstroms. Such a film was deposited using 1 second pulses of $TaF_5$ at 70° C., 0.5 second pulses of $H_2O$ vapor at 16° C. at 5 sccm, 1 second argon purge pulses at 30 sccm and 3 seconds pumping thereafter intermediate the $TaF_5$ and $H_2O$ pulses, a substrate temperature of 250° C., and 500 of each such cycles. The material had a dielectric constant of 45, and current leakage was on the order of $10^{-8}$ amps/$cm^2$.

An alternate exemplary and better-resulting product was obtained utilizing top and bottom electrodes 500 Angstroms thick which each comprised a combination of rhodium and platinum. The dielectric film consisted essentially of tantalum pentoxide deposited to a film thickness of 1330 Angstroms. The precursor pulses were 1 second of $TaF_5$ at 70° C. and 0.2 seconds of $H_2O$ at ambient room temperature conditions, with 1 second argon purge pulses at 30 sccm and 3 seconds pumping thereafter intermediate the $TaF_5$ and $H_2O$ pulses. Substrate temperature was 275° C., and the $TaF_5$ and $H_{20}$ pulses were conducted for 800 cycles each. The crystalline phase was predominately 001 hexagonal phase orientation, the material had a dielectric constant of about 100, and current leakage was in the high $10^{-8}$ amps/$cm^2$ range.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a $Ta_2O_5$ comprising layer on a substrate, comprising:
    positioning a substrate within a deposition chamber; and
    feeding gaseous precursors comprising $TaF_5$ and at least one of $H_2O$ and $O_3$ to the deposition chamber under conditions effective to deposit a $Ta_2O_5$ comprising layer on the substrate, the conditions being effective to form at least a majority of the $Ta_2O_5$ to be crystalline in a 001 oriented hexagonal phase as initially deposited.

2. The method of claim 1 wherein the $Ta_2O_5$ comprising layer is deposited onto a substrate outer surface which is substantially crystalline.

3. The method of claim 1 wherein the conditions comprise feeding $TaF_5$ and at least one of $H_2O$ and $O_3$ to the deposition chamber at the same time.

4. The method of claim 1 wherein the conditions comprise feeding $TaF_5$ and at least one of $H_2O$ and $O_3$ to the deposition chamber at different respective times.

5. The method of claim 4 wherein the conditions are void of any inert purge gas feeding to the chamber at any time intermediate said different respective times.

6. The method of claim 4 further comprising a period of time intermediate said different respective times when no detectable gaseous precursor is fed to the chamber, an inert purge gas being fed to the chamber during at least some of said intermediate period of time.

7. The method of claim 4 wherein some of the $TaF_5$ and at least one of the $H_2O$ and $O_3$ feedings overlap in time.

8. The method of claim 4 wherein neither of the $TaF_5$ and at least one of the $H_2O$ and $O_3$ feedings overlap in time.

9. The method of claim 1 wherein the conditions comprise plasma generation of at least one of the precursors.

10. The method of claim 9 wherein the plasma generation is within the deposition chamber.

11. The method of claim 9 wherein the plasma generation is remote from the deposition chamber.

12. The method of claim 1 wherein the conditions are void of plasma generation of the precursors.

13. The method of claim 1 wherein $H_2O$ comprises one of the gaseous precursors.

14. The method of claim 1 wherein $O_3$ comprises one of the gaseous precursors.

15. The method of claim 1 wherein the gaseous precursors comprise a combined feeding of $O_3$ and $O_2$.

16. The method of claim 1 wherein the gaseous precursors comprise $H_2O$ and $O_3$.

17. The method of claim 16 wherein the conditions comprises a combined feeding of the $H_2O$ and the $O_3$.

18. The method of claim 1 wherein the gaseous precursors comprise $H_2O$, $O_3$, and $O_2$.

19. The method of claim 18 wherein the conditions comprises a combined feeding of the $H_2O$, the $O_3$ and the $O_2$.

20. The method of claim 1 wherein the conditions are void of feeding any detectable level of $H_2$ to the deposition chamber.

21. The method of claim 1 wherein the conditions comprise a substrate temperature of from about 200° C. to about 400° C.

22. The method of claim 1 wherein the conditions comprise a substrate temperature of from about 250° C. to about 300° C.

23. The method of claim 1 wherein the conditions comprise a chamber pressure of from about $1 \times 10^{-7}$ to about 10 Torr.

24. The method of claim 1 wherein the conditions comprise a chamber pressure of from about $1 \times 10^{-3}$ to about 10 Torr.

25. The method of claim 1 wherein the conditions comprise atomic layer deposition.

26. The method of claim 1 wherein the conditions comprise chemical vapor deposition.

27. The method of claim 1 wherein the conditions comprise atomic layer deposition for a period of time and chemical vapor deposition for another period of time.

28. The method of claim 1 comprising fabricating the layer as at least part of a capacitor dielectric region.

29. A method of forming a $Ta_2O_5$ comprising layer on a substrate, comprising:

positioning a substrate within a deposition chamber; and feeding gaseous precursors comprising $TaF_5$ and $H_2O$ to the deposition chamber under conditions effective to deposit a $Ta_2O_5$ comprising layer on the substrate having at least a majority of the $Ta_2O_5$ to be crystalline in a 001 oriented hexagonal phase as initially deposited.

30. The method of claim 29 wherein the conditions comprise feeding $O_3$ to the deposition chamber.

31. The method of claim 29 wherein the conditions comprise feeding $TaF_5$ and $H_2O$ to the deposition chamber at the same time.

32. The method of claim 29 wherein the conditions comprise feeding $TaF_5$ and $H_2O$ to the deposition chamber at different respective times.

33. The method of claim 32 wherein the conditions are void of any inert purge gas feeding to the chamber at any time intermediate said different respective times.

34. The method of claim 32 further comprising a period of time intermediate said different respective times when no detectable gaseous precursor is fed to the chamber, an inert purge gas being fed to the chamber during at least some of said intermediate period of time.

35. The method of claim 32 wherein some of the $TaF_5$ and the $H_2O$ feedings overlap in time.

36. The method of claim 32 wherein neither of the $TaF_5$ and the $H_2O$ feedings overlap in time.

37. The method of claim 29 wherein the conditions comprise plasma generation of at least one of the precursors.

38. The method of claim 37 wherein the plasma generation is within the deposition chamber.

39. The method of claim 37 wherein the plasma generation is remote from the deposition chamber.

40. The method of claim 29 wherein the conditions are void of plasma generation of the precursors.

41. The method of claim 29 wherein the conditions are void of feeding any detectable level of $H_2$ to the deposition chamber.

42. The method of claim 29 wherein the conditions comprise a substrate temperature of from about 200° C. to about 400° C.

43. The method of claim 29 wherein the conditions comprise a substrate temperature of from about 250° C. to about 300° C.

44. The method of claim 29 wherein the conditions comprise a chamber pressure of from about $1 \times 10^{-7}$ to about 10 Torr.

45. The method of claim 29 wherein the conditions comprise a chamber pressure of from about $1 \times 10^{-3}$ to about 10 Torr.

46. The method of claim 29 wherein the conditions comprise atomic layer position.

47. The method of claim 29 wherein the conditions comprise chemical vapor deposition.

48. The method of claim 29 wherein the conditions comprise atomic layer position for a period of time and chemical vapor deposition for another period of time.

49. The method of claim 29 comprising fabricating the layer as at least part of a capacitor dielectric region.

50. An atomic layer deposition method of forming a $Ta_2O_5$ comprising layer on a substrate, comprising:

positioning a substrate within a deposition chamber;

chemisorbing a first species to form a first species monolayer onto the substrate within the chamber from a gaseous first precursor comprising $TaF_5$;

contacting the chemisorbed first species with a gaseous second precursor comprising at least one of $H_2O$ and $O_3$ to react with the first species to form a monolayer comprising Ta and O; and successively repeating said chemisorbing and contacting under conditions effective to form a mass of material on the substrate comprising $Ta_2O_5$ the successively repeating being effective to form at least a majority of the $Ta_2O_5$ to be crystalline in a 001 oriented hexagonal phase as initially deposited.

51. The method of claim 50 further comprising a period of time intermediate said chemisorbing and contacting wherein no detectable gaseous precursor is fed to the chamber.

52. The method of claim 50 further comprising a period of time intermediate said chemisorbing and contacting wherein no detectable gaseous precursor is fed to the chamber, an inert purge gas being fed to the chamber during at least some of said intermediate period of time.

53. The method of claim 50 wherein composition of the gaseous second precursor changes at least once during the successively repeating.

54. The method of claim 50 wherein the first species is formed continuously over the substrate.

55. The method of claim 50 further comprising at least after some of the successively repeating, chemical vapor depositing $Ta_2O_5$ onto the mass of material using the first and second gaseous precursors.

56. The method of claim 50 wherein the $Ta_2O_5$ is deposited onto a substrate outer surface which is substantially crystalline.

57. The method of claim 50 comprising plasma generation of at least one of the first and second precursors.

58. The method of claim 57 wherein the plasma generation is within the deposition chamber.

59. The method of claim 57 wherein the plasma generation is remote from the deposition chamber.

60. The method of claim 50 wherein the chemisorbing and the contacting are void of plasma generation of the precursors.

61. The method of claim 50 wherein the gaseous second precursor comprises $H_2O$.

62. The method of claim 50 wherein the gaseous second precursor comprises $O_3$.

63. The method of claim 50 wherein the gaseous second precursor comprises both $O_3$ and $O_2$.

64. The method of claim 50 wherein the gaseous second precursor comprises both $H_2O$ and $O_3$.

65. The method of claim 50 wherein the gaseous second precursor comprises all of $H_2O$, $O_3$, and $O_2$.

66. The method of claim 50 wherein the chemisorbing and the contacting comprise a substrate temperature of from about 200° C. to about 400° C.

67. The method of claim 50 wherein the chemisorbing and the contacting comprise a substrate temperature of from about 250° C. to about 300° C.

68. The method of claim 50 wherein the chemisorbing and the contacting comprise a chamber pressure of from about $1 \times 10^{-7}$ to about 10 Torr.

69. The method of claim 50 wherein the chemisorbing and the contacting comprise a chamber pressure of from about $1 \times 10^{-3}$ to about 10 Torr.

70. The method of claim 50 comprising fabricating the layer as at least a capacitor dielectric region.

* * * * *

UNITED STATES PATENT AND TRADEMARK OFFICE
CERTIFICATE OF CORRECTION

PATENT NO. : 6,863,725 B2
DATED : March 8, 2005
INVENTOR(S) : Vaartstra et al.

It is certified that error appears in the above-identified patent and that said Letters Patent is hereby corrected as shown below:

<u>Column 7,</u>
Lines 54 and 58, please delete "position" after "layer" and insert -- deposition --.

<u>Column 8,</u>
Line 65, please insert -- part of -- after "least".

Signed and Sealed this

Eleventh Day of October, 2005

JON W. DUDAS
*Director of the United States Patent and Trademark Office*